(12) United States Patent
Chen et al.

(10) Patent No.: US 10,069,234 B2
(45) Date of Patent: Sep. 4, 2018

(54) PORTABLE DATA TRANSMITTING DEVICE

(71) Applicant: Kingston Digital, Inc., Fountain Valley, CA (US)

(72) Inventors: Ben Wei Chen, Hsinchu (TW); Hsien-Chih Chang, Hsinchu (TW); Yi Ting Lin, Hsinchu (TW); Chih-Hung Wu, Hsinchu (TW)

(73) Assignee: Kingston Digital, Inc., Fountain Valley, CA (US)

( * ) Notice: Subject to any disclaimer, the term of this patent is extended or adjusted under 35 U.S.C. 154(b) by 0 days.

(21) Appl. No.: 15/374,440

(22) Filed: Dec. 9, 2016

(65) Prior Publication Data
US 2018/0069340 A1    Mar. 8, 2018

(30) Foreign Application Priority Data
Sep. 7, 2016    (TW) .............................. 105213762 U

(51) Int. Cl.
*G11C 7/10*    (2006.01)
*G06K 19/077*    (2006.01)
(Continued)

(52) U.S. Cl.
CPC ........... *H01R 13/44* (2013.01); *H01R 13/502* (2013.01); *H05K 5/0278* (2013.01)

(58) Field of Classification Search
CPC ............. G06K 19/07732; G06K 19/04; G06K 19/07733; G06K 19/07741; G06K 7/0021; H05K 5/0278; H05K 5/026; H05K 5/0217; H05K 5/0282; H05K 5/0291; G06F 13/38; G06F 1/187; G06F 2206/1014; G06F 3/0619; G06F 3/0652; G06F 3/0679; G06F 12/0246; G06F 13/4095; G11C 16/04;
(Continued)

(56) References Cited

U.S. PATENT DOCUMENTS 7,824,186 B2 * 11/2010 Zhao ..................... H01R 13/64
                                                    439/13
9,160,822 B2 * 10/2015 Joseph .................. H01R 31/06
(Continued)

FOREIGN PATENT DOCUMENTS

CN        204834056 U  * 12/2015

OTHER PUBLICATIONS

English Translation of CN 204834056.*

*Primary Examiner* — Michael A Lyons
*Assistant Examiner* — Matthew T Dzierzynski
(74) *Attorney, Agent, or Firm* — Skaar Ulbrich Macari, P.A.

(57) ABSTRACT

A portable data transmitting device, including a storage portion and a movable portion, is disclosed. The storage portion includes a fixed housing including a first side and a second side, and a first plug connector disposed on the first side. The movable portion includes a rotatable housing that is rotatably disposed on the second side of the fixed housing, a slidable housing that includes a first side and is slidably disposed on the rotatable housing, and a second plug connector disposed on the first side of the slidable housing. Thereby, the portable data transmitting device can be attached to portable apparatuses with different thicknesses, and can abut on the portable apparatus so as not to wobble or be bent easily.

13 Claims, 8 Drawing Sheets

(51) Int. Cl.
*H01R 35/04* (2006.01)
*H01R 13/44* (2006.01)
*H05K 5/02* (2006.01)
*H01R 13/502* (2006.01)

(58) Field of Classification Search
CPC ........ H01R 24/68; H01R 24/76; H01R 31/00;
H01R 31/06; H02J 2007/0062; H02J
7/0045; H02J 7/0052; H02J 7/355
USPC ......... 439/131, 640, 509, 247, 460, 502, 50,
439/511, 606, 655, 752
See application file for complete search history.

(56) References Cited

U.S. PATENT DOCUMENTS

| | | | |
|---|---|---|---|
| 9,192,063 B2 * | 11/2015 | Lin | H05K 5/0217 |
| 9,363,911 B2 * | 6/2016 | Chou | G06K 7/0021 |
| 9,438,298 B2 * | 9/2016 | Abramovich | H04B 1/3888 |
| 9,454,193 B2 * | 9/2016 | Anderson | G06F 3/0619 |
| 9,602,639 B2 * | 3/2017 | Carnevali | H04M 1/0254 |
| 2012/0212177 A1 * | 8/2012 | Peacock | H02J 7/0054 320/107 |
| 2014/0281139 A1 * | 9/2014 | Smurthwaite | G06F 12/0246 711/103 |
| 2016/0013675 A1 * | 1/2016 | Workman | H02J 7/0045 320/101 |

* cited by examiner

PORTABLE DATA TRANSMITTING DEVICE

PRIORITY

This application claims priority to Taiwan Patent Application No. 105213762 filed on Sep. 7, 2016, which is incorporated herein by reference in its entirety.

FIELD

The present invention relates to a portable data transmitting device, and particularly, to a portable data transmitting device suitable for mobile apparatuses of different thicknesses.

BACKGROUND

With the advancement of science and technologies, use of mobile apparatuses such as smartphones and tablet computers has become increasingly widespread. Because built-in memories of such mobile apparatuses have a limited capacity and are difficult to be extended, portable data transmitting devices that can be externally attached to such mobile apparatuses have been developed to additionally provide a sufficient storage capacity for the user. Moreover, this kind of portable data transmitting devices can also be connected to computers or other electronic products.

However, when being connected to a mobile apparatus, such a portable data transmitting device usually protrudes and suspends from an interface located on a bottom surface of the mobile apparatus. This causes inconveniences in use of the portable data transmitting device (i.e., the user shall pay special attention to prevent the portable data transmitting device from being knocked by other objects), and the protruding portable data transmitting device is liable to wobbling or being bent that would cause damage to the connector of the portable data transmitting device or even to the interface of the mobile apparatus.

In view of this concern, an L-shaped portable data transmission device has been proposed in the industry. That is, when the portable data transmitting device is connected to the mobile apparatus, a body of the portable data transmitting device is located on a back cover of the mobile apparatus to reduce the protruding extent. However, the distance between the connector and the body of such a portable data transmitting device is invariable, so the portable data transmitting device cannot be used for mobile apparatuses of different thicknesses. In other words, in case of a mobile apparatus having a relatively small thickness, the body of the portable data transmitting device is unable to abut on the back cover of the mobile apparatus but, rather, suspends from above the back cover, so there is still a possibility of wobbling or being bent; and in case of a mobile apparatus having a relatively large thickness, the connector of the portable data transmitting device is unable to be inserted into the interface of the mobile apparatus.

Accordingly, how to make improvement on the aforesaid shortcomings is still a problem to be solved in the art.

SUMMARY

An objective of the present invention is to provide a portable data transmitting device which can make improvement on one of the aforesaid shortcomings. That is, the portable data transmitting device provided herein can be inserted into and abut on mobile apparatuses of different thicknesses to reduce the possibility of wobbling or being bent.

The disclosure includes a portable data transmitting device, comprising: a storage portion, which comprises a fixed housing and a first plug connector, wherein the fixed housing includes a first side and a second side disposed oppositely, and the first plug connector is disposed on the first side; and a movable portion, which comprises a rotatable housing, a slidable housing and a second plug connector, wherein the rotatable housing is rotatably disposed on the second side of the fixed housing, the slidable housing is slidably disposed on the rotatable housing and includes a first side facing the same direction as the first side of the fixed housing, and the second plug connector is disposed on the first side of the slidable housing.

In this way, the movable portion can rotate relative to the storage portion so that the second plug connector of the movable portion is spaced apart from the storage portion by a distance; the rotatable housing and the slidable housing of the movable portion can slide relative to each other to make a distance between the second plug connector and the storage portion adjustable. Thereby, the distance between the second plug connector and the storage portion can be adjusted according to the thickness of the mobile apparatus so that the second plug connector can be inserted into the interface of the mobile apparatus and the storage portion can securely abut on the mobile apparatus without wobbling or being bent.

The above summary is not intended to limit the scope of the invention, or describe each embodiment, aspect, implementation, feature or advantage of the invention. The detailed technology and preferred embodiments for the subject invention are described in the following paragraphs accompanying the appended drawings for people skilled in this field to well appreciate the features of the claimed invention. It is understood that the features mentioned hereinbefore and those to be commented on hereinafter may be used not only in the specified combinations, but also in other combinations or in isolation, without departing from the scope of the present invention.

DETAILED DESCRIPTION

In the following descriptions, the present invention will be explained with reference to various exemplary embodiments. Nevertheless, these embodiments are not intended to limit the present invention to any specific example, environment, application, or particular implementation described herein. Therefore, descriptions of these example embodiments are only provided for purpose of illustration rather than to limit the present invention. It is understood that the various features and aspects discussed herein may be used in any combination, or in isolation, without departing from the scope of the present invention.

Figure 1:
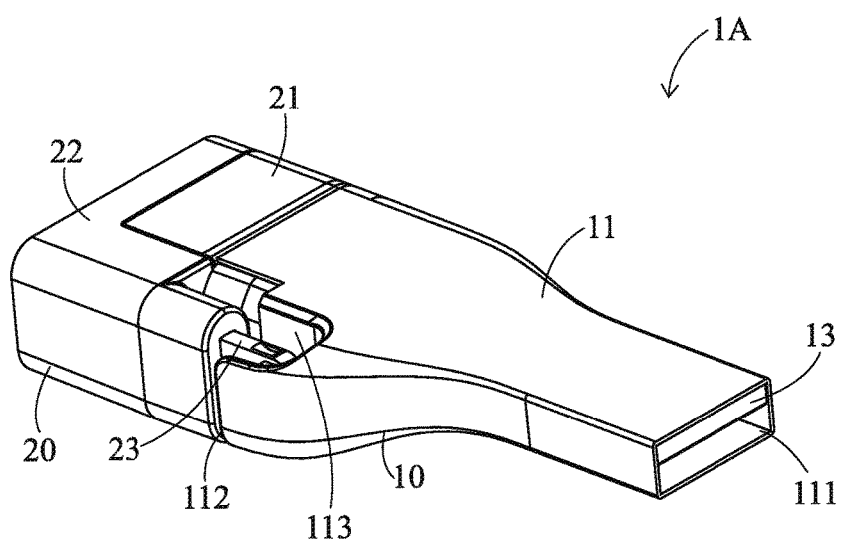
FIG. 1 is a perspective view of a portable data transmitting device according to a preferred embodiment of the present invention.
Figure 2:
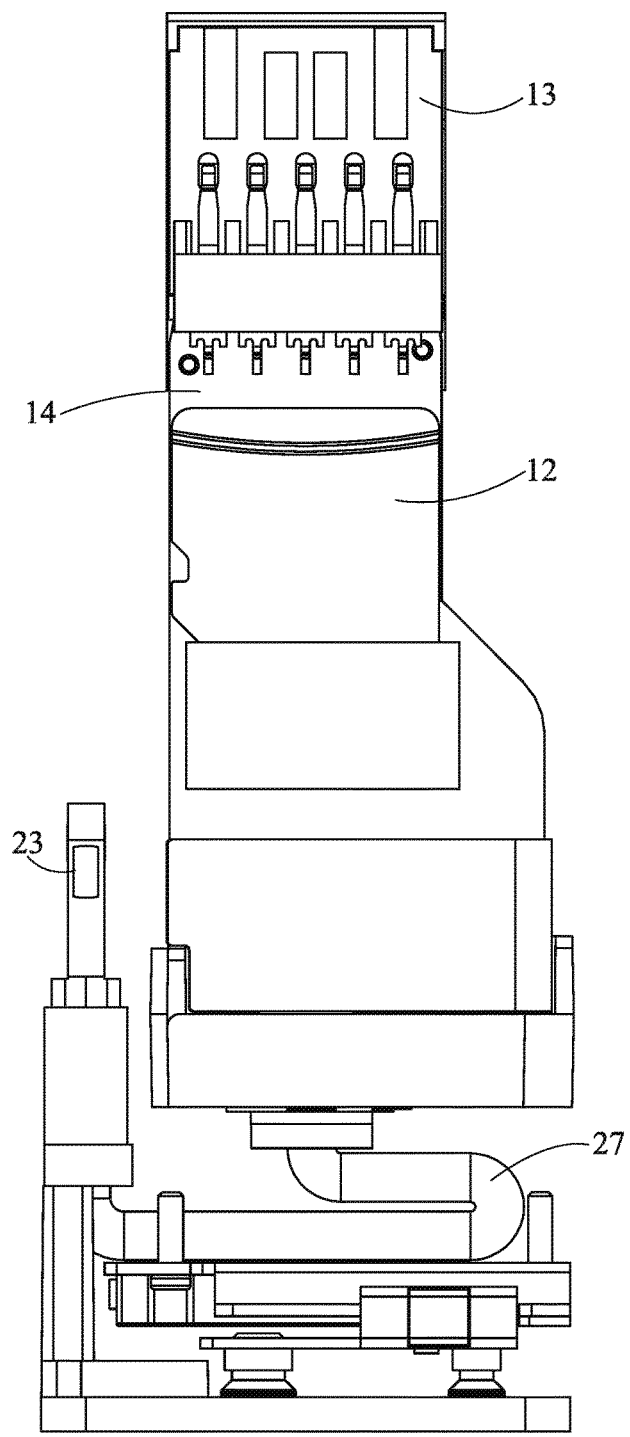
FIG. 2 is a schematic view of internal elements of the portable data transmitting device according to a preferred embodiment of the present invention.

Referring to FIG. 1 and FIG. 2, a perspective view of a portable data transmitting device according to a preferred embodiment of the present invention and a schematic view of external elements thereof are shown therein. In the preferred embodiment of the present invention, a portable data transmitting device 1A that comprises a storage portion 10 and a movable portion 20 is disclosed. Technical contents of the individual elements will be described in sequence hereinbelow.

The storage portion 10 comprises a fixed housing 11, a memory 12 and a first plug connector 13. The fixed housing 11 comprises a first side 111 and a second side 112 disposed oppositely. Specifically, the first side 111 and the second side 112 are spaced apart without any border line therebetween, and are defined at opposite ends of the fixed housing 11 respectively; each of the first side 111 and the second side 112 may be comprised of a single surface or multiple surfaces.

The memory 12 is disposed in the fixed housing 11 (e.g., as shown in FIG. 2), and may be disposed on a circuit board 14 located in the fixed housing 11; data (e.g., data from an electronic product such as a computer or mobile apparatus connected to the portable data transmitting device 1A) can be accessed from the memory 12. The first plug connector 13 is disposed on the first side 111 and may be recessed from the first side 111, i.e., the first plug connector 13 is disposed in the fixed housing 11 but with a part thereof being exposed from the first side 111 (or put in other words, a part of the fixed housing 11 forms the housing of the first plug connector 13). In other possible embodiments (not shown), the first plug connector 13 may protrude from the first side 111 of the fixed housing 11, i.e., the housing of the first plug connector 13 is not formed integrally with the fixed housing 11 (similar to the case where the second plug connector 23 shown in FIG. 4A protrudes from the first side 221 of the slidable housing 22).

Pins of the first plug connector 13 may be disposed on the circuit board 14 to electrically connect the first plug connector 13 to the memory 12; and a part of the circuit board 14 may form a substrate of the first plug connector 13. Thus, the portable data transmitting device 1A may be connected via the first plug connector 13 to other electronic products such as a computer so as to transmit data of the memory 12 to the electronic product or vice versa. The first plug connector 13 may be (but is not limited to) a USB connector.

Figure 3A:
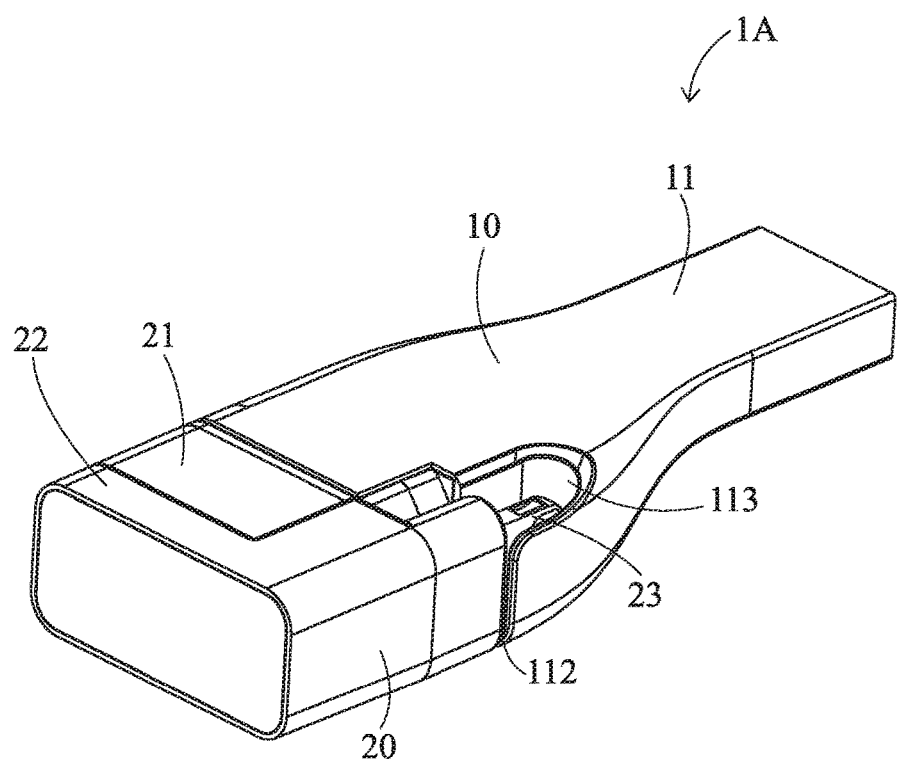
FIG. 3A is a schematic view illustrating a stored state of the portable data transmitting device according to a preferred embodiment of the present invention.

The movable portion 20 comprises a rotatable housing 21, a slidable housing 22 and a second plug connector 23. The rotatable housing 21 is rotatably disposed on the second side 112 of the fixed housing 11 so that the rotatable housing 21 can rotate between a first position (in a stored state shown in FIG. 3A) and a second position (in a standby state shown in FIG. 3B or an in-use state shown in FIG. 3C) relative to the fixed housing 11.

Figure 4A:
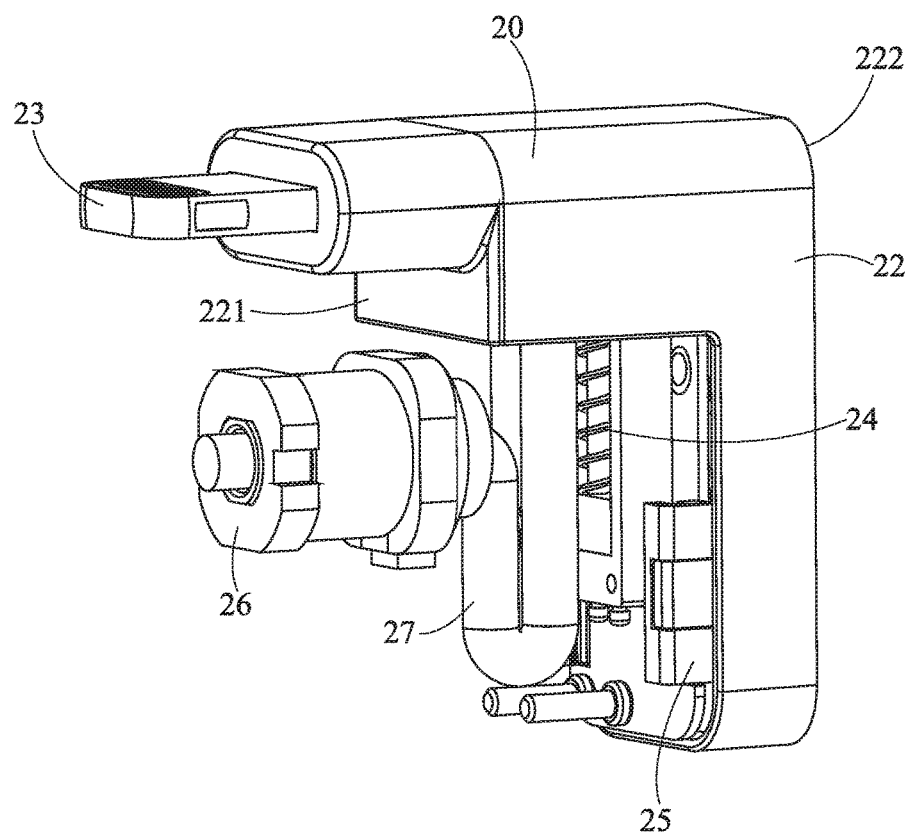
FIG. 4A is a schematic view illustrating a movable portion of the portable data transmitting device in the standby state according to a preferred embodiment of the present invention.

Specifically, the movable portion 20 may further comprise a rotatable shaft 26 disposed on the rotatable housing 21 (as shown in FIG. 4A), and the rotatable shaft 26 is pivoted to the second side 112 of the fixed housing 11 (in which case the second side 112 shall have a hole corresponding to the rotatable shaft 26) so that the rotatable housing 21 rotates about the rotatable shaft 26 relative to the fixed housing 11. In other embodiments (not shown) where the rotatable shaft 26 can be disposed on the second side 112 of the fixed housing 11 and pivoted to the rotatable housing 21 (in which case the rotatable housing 21 shall have a hole corresponding to the rotatable shaft 26), the purpose of having the rotatable housing 21 rotate about the rotatable shaft 26 relative to the fixed housing 11 can also be achieved. When the rotatable housing 21 rotates relative to the fixed housing 11, the sliding housing 22 will rotate together.

Additionally, the movable portion 20 or the storage portion 10 may further comprise a positioning structure (e.g., a fixture block, not shown). The positioning structure is disposed between the rotatable housing 21 and the fixed housing 11 to position the rotatable housing 21 after the rotatable housing 21 has rotated, relative to the fixed housing 11, to a certain angle (e.g., 0° or 90°, or to the first position or the second position). Then, when the portable data transmitting device 1A is in the stored state or the standby state, the rotatable housing 21 will not rotate relative to the fixed housing 11 easily except when a force is intentionally applied by the user.

The slidable housing 22 is slidably disposed on the rotatable housing 21. In other words, the slidable housing 22 can slide relative to the rotatable housing 21 to extend or decrease the overall length of the movable portion 20 (e.g., the standby state shown in FIG. 3B or the in-use state shown in FIG. 3C) so as to adapt to mobile apparatuses of different thicknesses. When the slidable housing 22 slides relative to the rotatable housing 21, the slidable housing 22 will slide also relative to the storage portion 10.

Figure 4B:
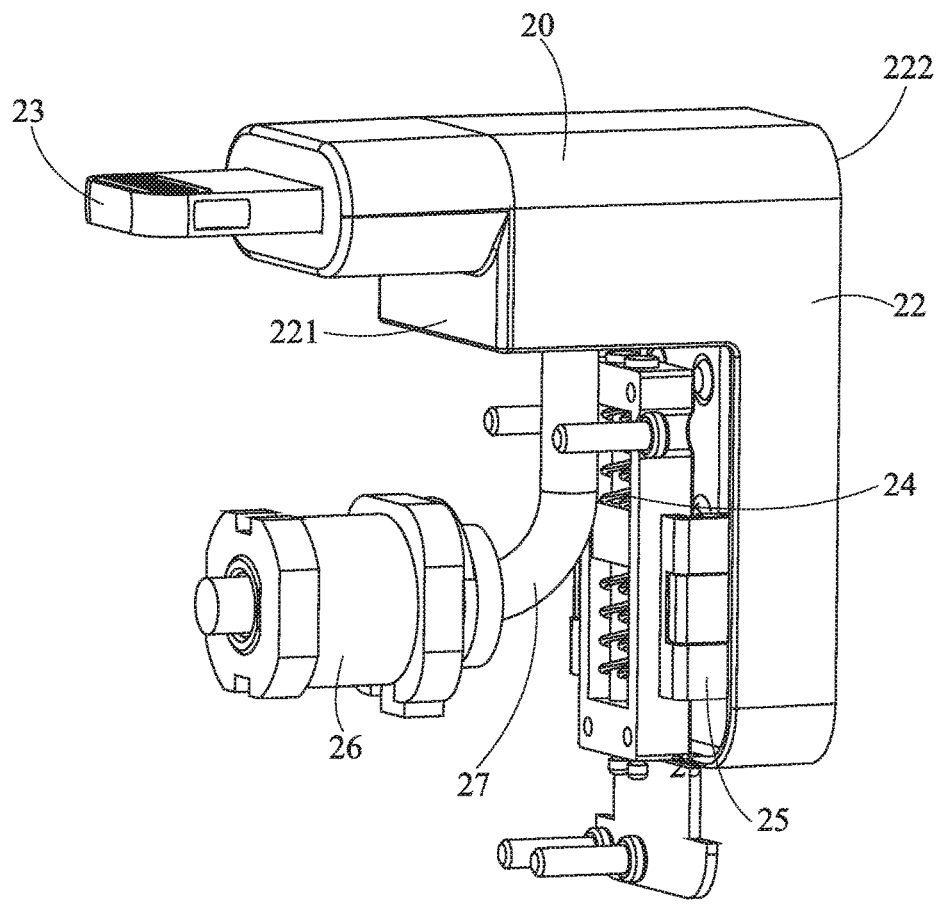
FIG. 4B is a schematic view illustrating the movable portion of the portable data transmitting device in the in-use state according to a preferred embodiment of the present invention.
Figure 5:
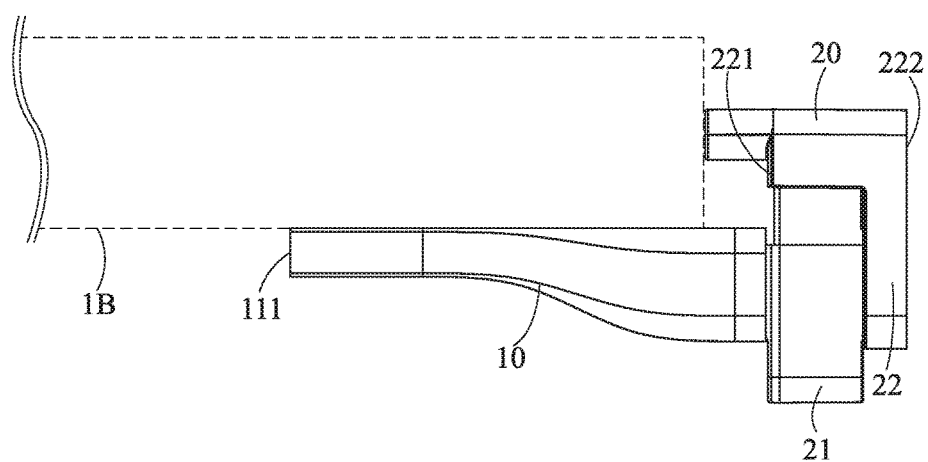
FIG. 5 is a schematic view illustrating the portable data transmitting device and the mobile apparatus joined together according to a preferred embodiment of the present invention.

In this embodiment, the movable portion 20 may further comprise a sliding structure 25 (as shown in FIG. 4A and FIG. 4B). The sliding structure 25 is disposed between the slidable housing 22 and the rotatable housing 21 in the form of a guiding rail and a sliding block to reduce the frictional force in the sliding process and avoid any offset in the sliding direction. The sliding structure 25 is disposed in the rotatable housing 21 and the slidable housing 22 without being exposed outside, but in other embodiments, the sliding structure 25 may also be exposed from the rotatable housing 21 and the slidable housing 22.

The slidable housing 22 comprises a first side 221 and a second side 222. The first side 221 faces the same direction as the first side 111 of the fixed housing 11 (e.g., both facing the front direction), and the second side 222 is defined on a side of the slidable housing 22 opposite to the first side 221 and is parallel to the first side 221, and the second side 222 may be selectively provided with a concave structure or a gripping structure (not shown) so that, when the portable data transmitting device 1A is in the standby state, the user can slide the slidable housing 22 to an appropriate position easily to be connected with the mobile apparatus.

Further, the second plug connector 23 is disposed on and protrudes from the first side 221 of the slidable housing 22, and via a flexible line 27 passing through the rotatable shaft 26, is electrically connected to the memory 12 so that the connection between the second plug connector 23 and the memory 12 will not be interrupted due to rotation of the movable portion 21 or sliding movement of the slidable housing 22. Additionally, the portable data transmitting device 1A can be connected to the mobile device via the second plug connector 23 to transmit data of the mobile device to and store the data in the memory 12 or vice versa. The second plug connector 23 may be (but is not limited to) a Lightning connector developed by Apple Inc.; and the second plug connector 23 may also be a USB connector.

In other possible embodiments, the fixed housing 11 of the storage portion 10 may comprise an insert slot (not shown), and the memory 12 may be a memory card 12 detachably inserted in the insert slot. Then, the first plug connector 13 and the second plug connector 23 may be electrically connected via such elements as the circuit board 14 and the line 27 to transmit and store data with the memory card 12. In other words, the memory card 12 is not fixed and enclosed in the fixed housing 11 but is pluggable and detachable with respect to the fixed housing 11 so that the memory card 12 can be replaced by the user. After being detached from the fixed housing 11, the memory card 12 may also be inserted into an insert slot of another electronic product. In such an embodiment, the portable data transmission device 1A may be applied as a card reader without a built-in memory 12 or a memory card 12.

Referring back to FIG. 1, it shall be appreciated that, to prevent the second plug connector 23 from being damaged by an external force or foreign matters before being connected to the mobile apparatus, the fixed housing 11 of the storage portion 10 may further comprise a receiving slot 113, an opening of which is disposed on the second side 112 and has a size adapted to receive the second plug connector 23. In this way, the second plug connector 23 may be selectively disposed in the receiving slot 113 when the portable data transmitting device 1A is in the stored state.

Referring to FIG. 4A and FIG. 4B, preferably the movable portion 20 may further comprise a restoring structure 24. The restoring structure 24 may be a spring, an elastic piece or an elastic string disposed between the slidable housing 22 and the rotatable housing 21. Specifically, the restoring structure 24 has one end fixed onto the rotatable housing 21 and the other end fixed onto the slidable housing 22 to provide a restoring force towards the rotatable housing 21. That is, the restoring structure 24 may store a restoring force when the slidable housing 22 slides away from the rotatable housing 21, and restore the slidable housing 22 back into the initial position when the external force applied to the slidable housing 22 disappears.

Referring to FIGS. 3A to 3C and FIG. 5, how the portable data transmitting device 1A is connected to the mobile apparatus 1B will be described.

Figure 3B:
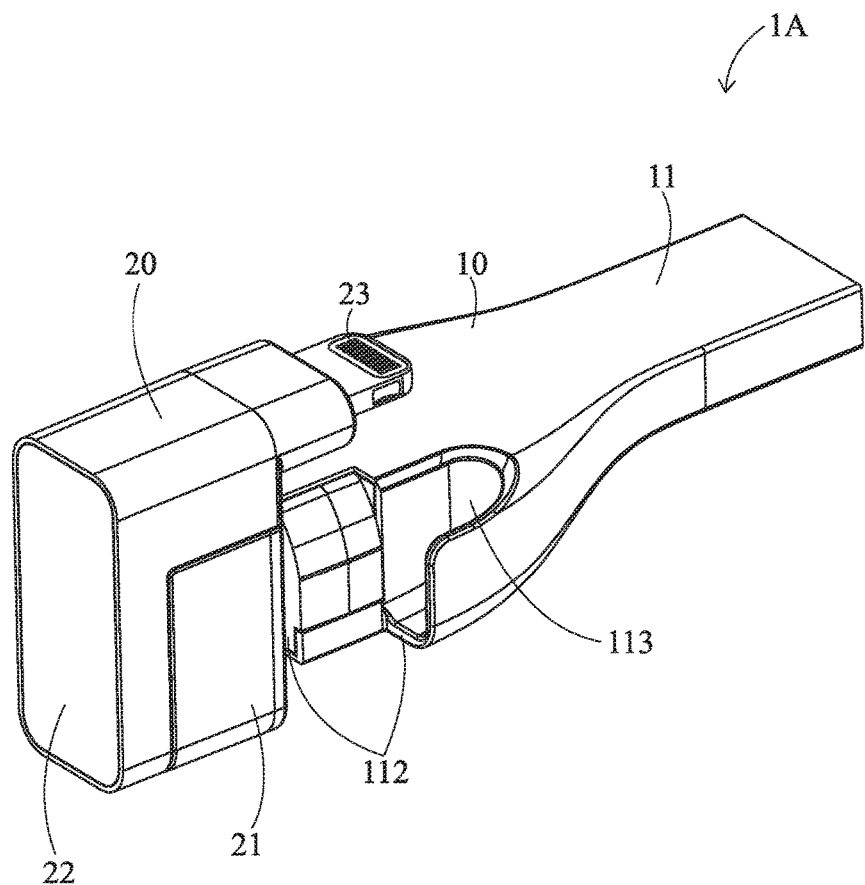
FIG. 3B is a schematic view illustrating a standby state of the portable data transmitting device according to a preferred embodiment of the present invention.
Figure 3C:
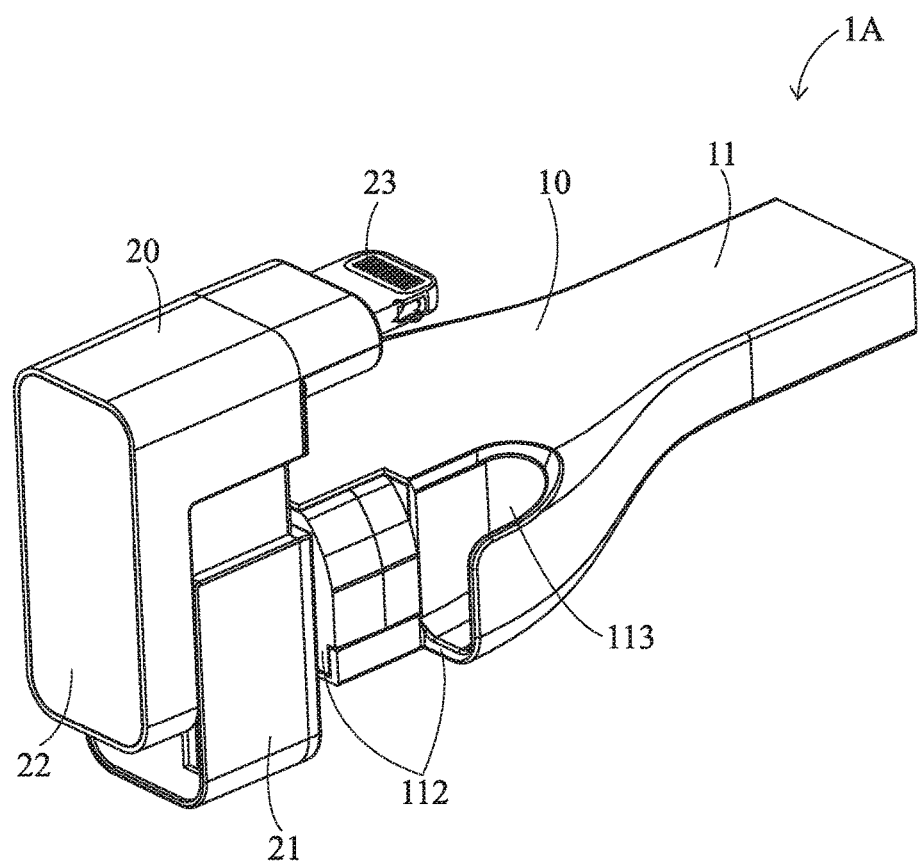
FIG. 3C is a schematic view illustrating an in-use state of the portable data transmitting device according to a preferred embodiment of the present invention.

Firstly, the movable portion 20 is rotated relative to the storage portion 10 by the user (as shown in FIG. 3B) so that the second plug connector 23 of the movable portion 20 is spaced apart from the fixed housing 11 of the storage portion 10 by an initial distance. This distance may be designed to be relatively small to adapt to a thin mobile apparatus. If the thickness of the mobile apparatus 1B itself or of a protective cover thereof is greater than the initial distance, the user may slide the slidable housing 22 relative to the rotatable housing 21 (as shown in FIG. 3C) to increase the distance between the second plug connector 23 and the fixed housing 11. The distance that can be increased may be designed to be relatively large so as to adapt to a thick mobile apparatus.

Then the second plug connector 23 is inserted into an interface of the mobile apparatus 1B, with the back cover of the mobile apparatus 1B being located between the second plug connector 23 and the fixed housing 11. If there is a clearance between the back cover of the mobile apparatus 1B and the fixed housing 11, the user may slide the slidable housing 22 relative to the rotatable housing 21 to have the fixed housing 11 abut on the back cover of the mobile apparatus 1B. If the movable portion 20 comprises the restoring structure 24 (as shown in FIG. 4A), the restoring structure 24 can automatically drive the fixed housing 11 to abut on the mobile apparatus 1B and the restoring force provided by the restoring structure 24 can also push the fixed housing 11 to the mobile apparatus 1B.

Once the second plug connector 23 is detached from the interface of the mobile apparatus 1B, the user may slide the slidable housing 22 to the initial position to restore the standby state (as shown in FIG. 3B); and if the movable portion 20 comprises the restoring structure 24, then the slidable housing 22 will automatically slide to the initial position to restore the standby state.

In summary, the portable data transmitting device proposed in the preferred embodiments of the present invention can adjust the distance between the second plug connector and the storage portion in response to different thicknesses of mobile apparatuses (instead of having a fixed distance as is conventional); and after the portable data transmitting device is connected to a mobile apparatus, there will be no significant clearance between the storage portion and the mobile apparatus (i.e., the storage portion will not be suspended in the air), so the storage portion is not liable to wobbling or being bent to cause damage of the portable data transmitting device or the mobile apparatus. Additionally, the restoring structure can have the portable data transmitting device abut on the mobile apparatus securely without being liable to wobbling or being bent. Furthermore, the portable data transmitting device may be applied as a mobile disk or a card reader.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A portable data transmitting device, comprising:
    a storage portion, which comprises a fixed housing and a first plug connector, wherein the fixed housing includes a first side and a second side disposed oppositely, and the first plug connector is disposed on the first side; and
    a movable portion, which comprises a rotatable housing, a slidable housing and a second plug connector, wherein the rotatable housing is rotatably disposed on the second side of the fixed housing, the slidable housing is slidably disposed on the rotatable housing and includes a first side facing the same direction as the first side of the fixed housing, and the second plug connector is disposed on the first side of the slidable housing;
    wherein, the slidable housing is slidable to extend or decrease an overall length of the movable portion to enable the fixed housing to abut on a mobile apparatus connected to the second plug connector.

2. The portable data transmitting device of claim 1, wherein the movable portion further comprises a restoring structure, an end of which is fixed onto the rotatable housing and another end of which is fixed onto the slidable housing, and the restoring structure provides a restoring force towards the rotatable housing.

3. The portable data transmitting device of claim 2, wherein the restoring structure comprises a spring, an elastic piece, or an elastic string.

4. The portable data transmitting device of claim 1, wherein the movable portion further comprises a sliding structure disposed on the rotatable housing and the slidable housing.

5. The portable data transmitting device of claim 4, wherein the sliding structure comprises a sliding block disposed on the slidable housing and a guiding rail disposed on the rotatable housing.

6. The portable data transmitting device of claim 1, wherein the fixed housing comprises a receiving slot, an opening of which is disposed on the second side, and the second plug connector is selectively disposed in the receiving slot.

7. The portable data transmitting device of claim 1, wherein the movable portion further comprises a rotatable shaft disposed on the rotatable housing and pivotally connected to the second side of the fixed housing.

8. The portable data transmitting device of claim 1, wherein the storage portion further comprises a rotatable shaft disposed on the second side of the fixed housing and pivotally connected to the rotatable housing.

9. The portable data transmitting device of claim 1, wherein the movable portion or the storage portion comprises a positioning structure to position the rotatable housing after the rotatable housing rotates, relative to the fixed housing, to a certain angle.

10. The portable data transmitting device of claim 1, wherein the first plug connector is a USB connector, and the second plug connector is a Lightning connector.

11. The portable data transmitting device of claim 1, wherein the slidable housing further includes a concave structure or a gripping structure disposed on a second side of the slidable housing.

12. The portable data transmitting device of claim 1, wherein the storage portion further comprises a memory, which is disposed in the fixed housing and electrically connected to the first plug connector and the second plug connector.

13. The portable data transmitting device of claim 1, wherein the storage portion further comprises a memory card, the fixed housing includes an insert slot, and the memory card is detachably inserted into the insert slot to electrically connect to the first plug connector and the second plug connector.

* * * * *